United States Patent
Waite et al.

(10) Patent No.: US 8,148,214 B2
(45) Date of Patent: Apr. 3, 2012

(54) STRESSED FIELD EFFECT TRANSISTOR AND METHODS FOR ITS FABRICATION

(75) Inventors: Andrew M. Waite, Hopeful Junction, NY (US); Scott Luning, Poughkeepsie, NY (US)

(73) Assignee: GlobalFoundries Inc., Grand Cayman (KY)

( * ) Notice: Subject to any disclaimer, the term of this patent is extended or adjusted under 35 U.S.C. 154(b) by 425 days.

(21) Appl. No.: 12/360,961

(22) Filed: Jan. 28, 2009

(65) Prior Publication Data

US 2009/0130803 A1    May 21, 2009

Related U.S. Application Data

(62) Division of application No. 11/536,126, filed on Sep. 28, 2006, now Pat. No. 7,504,301.

(51) Int. Cl.
*H01L 21/00* (2006.01)
(52) U.S. Cl. .................... 438/150; 438/255; 438/285
(58) Field of Classification Search .............. 438/150, 438/255, 285
See application file for complete search history.

(56) References Cited

U.S. PATENT DOCUMENTS

| | | | | |
|---|---|---|---|---|
| 6,723,621 | B1 * | 4/2004 | Cardone et al. | 438/478 |
| 7,067,855 | B2 * | 6/2006 | Cardone et al. | 257/190 |
| 7,335,959 | B2 * | 2/2008 | Curello et al. | 257/408 |
| 7,504,301 | B2 * | 3/2009 | Waite et al. | 438/255 |
| 7,906,413 | B2 * | 3/2011 | Cardone et al. | 438/486 |
| 2004/0185640 | A1 * | 9/2004 | Cardone et al. | 438/478 |
| 2005/0093077 | A1 | 5/2005 | Ieong et al. | |
| 2006/0076622 | A1 | 4/2006 | Wang et al. | |
| 2006/0194422 | A1 * | 8/2006 | Cardone et al. | 438/542 |
| 2007/0187767 | A1 * | 8/2007 | Yasutake | 257/368 |
| 2007/0190741 | A1 * | 8/2007 | Lindsay | 438/424 |
| 2007/0295989 | A1 * | 12/2007 | Han et al. | 257/192 |
| 2008/0001182 | A1 * | 1/2008 | Chen et al. | 257/255 |
| 2008/0006818 | A1 * | 1/2008 | Luo et al. | 257/19 |
| 2008/0079003 | A1 | 4/2008 | Shaheen et al. | |
| 2008/0079033 | A1 * | 4/2008 | Waite et al. | 257/255 |

(Continued)

FOREIGN PATENT DOCUMENTS

WO    2006/060054 A1    6/2006
WO    2006074438 A1    7/2006

OTHER PUBLICATIONS

Yasutake N et al: "A High Performance pMOSFET with Two-step Recessed SiGe-S/D Structure for 32nm mode and Beyond", Solid State Research Conference, 2006, Proceeding of the 36th European, IEEE, PI, Sep. 10, 2006 (Sep. 21, 2006), pp. 77-80, ZP031046997, ISBN: 1-4244-0301-4.

(Continued)

*Primary Examiner* — Laura Menz
(74) *Attorney, Agent, or Firm* — Ingrassia Fisher & Lorenz, P.C.

(57) ABSTRACT

A stressed field effect transistor and methods for its fabrication are provided. The field effect transistor comprises a silicon substrate with a gate insulator overlying the silicon substrate. A gate electrode overlies the gate insulator and defines a channel region in the silicon substrate underlying the gate electrode. A first silicon germanium region having a first thickness is embedded in the silicon substrate and contacts the channel region. A second silicon germanium region having a second thickness greater than the first thickness and spaced apart from the channel region is also embedded in the silicon substrate.

10 Claims, 7 Drawing Sheets

U.S. PATENT DOCUMENTS

| | | | |
|---|---|---|---|
| 2008/0119025 A1* | 5/2008 | Kwon et al. | 438/285 |
| 2008/0119031 A1* | 5/2008 | Pal et al. | 438/483 |
| 2008/0142835 A1* | 6/2008 | Peidous et al. | 257/190 |
| 2008/0164491 A1* | 7/2008 | Liu et al. | 257/190 |
| 2008/0199999 A1* | 8/2008 | Weijtmans et al. | 438/285 |
| 2008/0220579 A1* | 9/2008 | Pal et al. | 438/265 |
| 2009/0130803 A1* | 5/2009 | Waite et al. | 438/150 |
| 2011/0049643 A1* | 3/2011 | Matsuoka | 257/408 |

OTHER PUBLICATIONS

Ota K et al: "Scalable eSiGe S/D Technology with Less Layout Dependence for 45-nm Generation", 2006 Symposium on VLSI Technology (IEEE Cat. No. 06CH37743C) IEE Piscataway, USA, Jun. 13, 2006-Jun. 15, 2006, p. 2, pp. XP002466240.

Zhang D et al: "Embedded SiGe S/D PMOS on Thin Body SOI Substrate with Drive Current Enhancement", VLSI Technology, 2005, Digest of Technical Papers, 2005 Symposium on Kyoto, Japan, Jun. 14-16, 2005, Piscataway, USA, IEEE, Jun. 14, 2005, pp. 26-27, ZP010818158, ISBN: 4-907784-00-01.

International Search Report for PCT/US2007/020588, mailed Nov. 2, 2008.

* cited by examiner

STRESSED FIELD EFFECT TRANSISTOR AND METHODS FOR ITS FABRICATION

CROSS-REFERENCES TO RELATED APPLICATIONS

This is a division of application Ser. No. 11/536,126, filed Sep. 28, 2006.

TECHNICAL FIELD

The present invention generally relates to stressed field effect transistors and to methods for their fabrication, and more particularly relates to embedded silicon germanium stressed field effect transistors and to methods for their fabrication.

BACKGROUND

The majority of present day integrated circuits (ICs) are implemented by using a plurality of interconnected field effect transistors (FETs), also called metal oxide semiconductor field effect transistors (MOSFETs), or simply MOS transistors. A FET includes a gate electrode as a control electrode and spaced apart source and drain electrodes between which a current can flow. A control voltage applied to the gate electrode controls the flow of current through a channel between the source and drain electrodes.

The gain of an FET, usually defined by the transconductance ($g_m$), is proportional to the mobility of the majority carrier in the transistor channel. The current carrying capability of an MOS transistor is proportional to the transconductance times the width of the channel divided by the length of the channel ($g_m W/l$). FETs are usually fabricated on silicon substrates with a (100) crystallographic surface orientation, which is conventional for silicon technology. For this and many other orientations, the mobility of holes, the majority carrier in a P-channel FET (PFET), can be increased by applying a compressive longitudinal stress to the channel. A compressive longitudinal stress can be applied to the channel of FET by embedding an expanding material such as pseudomorphic SiGe in the silicon substrate at the ends of the transistor channel [For example, see IEEE Electron Device Letters v. 25, No 4, p. 191, 2004]. A silicon germanium (SiGe) crystal has a greater lattice constant than the lattice constant of a silicon crystal, and consequently the presence of embedded SiGe causes a deformation of the silicon matrix that, in turn, compresses the silicon in the channel region. Although a number of techniques are know for embedding SiGe to enhance the mobility of majority carrier holes in PFETs, none has yet achieved the increase in mobility potentially attainable with embedded silicon germanium.

Accordingly, it is desirable to provide a field effect transistor having enhanced majority carrier channel mobility. In addition, it is desirable to provide a method for fabricating a P-channel field effect transistor having enhanced hole mobility. Furthermore, other desirable features and characteristics of the present invention will become apparent from the subsequent detailed description and the appended claims, taken in conjunction with the accompanying drawings and the foregoing technical field and background.

BRIEF SUMMARY

A stressed field effect transistor having enhanced majority carrier mobility is provided. The stressed field effect transistor comprises a silicon substrate with a gate insulator overlying the silicon substrate. A gate electrode overlies the gate insulator and defines a channel region in the silicon substrate underlying the gate electrode. A first silicon germanium region having a first thickness is embedded in the silicon substrate and contacts the channel region. A second silicon germanium region having a second thickness greater than the first thickness and spaced apart from the channel region is also embedded in the silicon substrate.

Methods are provided for fabricating a stressed field effect transistor having enhanced majority carrier mobility. The method comprises forming a silicon on insulator substrate comprising a layer of silicon on a layer of insulator on a silicon substrate. A gate electrode is formed overlying the layer of silicon. A first undoped silicon germanium layer is epitaxially embedded into the silicon layer and aligned with the gate electrode. A second impurity doped silicon germanium layer is epitaxially embedded into the silicon layer and spaced apart from the gate electrode.

BRIEF DESCRIPTION OF THE DRAWINGS

The present invention will hereinafter be described in conjunction with the following drawing figures, wherein like numerals denote like elements, and wherein FIG. 1 schematically illustrates, in cross section, a field effect transistor in accordance with one embodiment of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
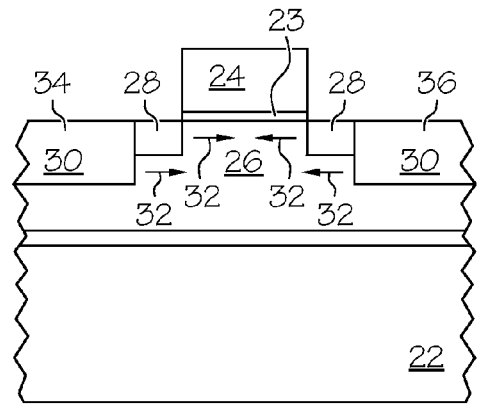

FIG. 1 schematically illustrates, in cross section, a field effect transistor (FET) 20, specifically a P-channel FET (PFET), in accordance with one embodiment of the invention. FET 20 includes a silicon substrate 22 having a gate insulator 23 formed at the substrate surface. A gate electrode 24 overlies the gate insulator. The gate electrode defines the location of a transistor channel 26 at the substrate surface and underlying the gate electrode. A shallow region of preferably undoped silicon germanium (SiGe) 28 is embedded into the silicon substrate in close proximity to the edges of the transistor channel. A deeper region of preferably in situ impurity doped SiGe 30 is embedded into the silicon substrate at a location spaced further apart from the channel region. The two embedded SiGe regions collectively impart a uniaxial compressive stress on channel region 26 as indicated by arrows 32 that enhances the mobility of majority carrier holes in the channel. The shallow embedded silicon germanium region positions the stress inducing material in close proximity to the channel region, but because this SiGe region is undoped there are no adverse effects from boron dopant encroaching the extensions and hence degrading device short channel performance. The deeper embedded silicon germanium region is effective in exerting stress on the channel region; the impurity doping is spaced apart from the channel and thus avoids channel encroachment, and the impurity doping serves to form the source 34 and drain 36 of the transistor. The use of selectively grown epitaxial SiGe that is in situ doped with boron (for example by the addition of an impurity doping gas such as diborane to the epitaxial growth reactants) saves an ion implantation step. The in situ impurity doping saves a processing step, but strain preservation is a more important advantage of the in situ doping. Ion implantation of strained SiGe regions has the adverse effect of causing the relaxation of the strain in the SiGe regions. Relaxation of the strain in the embedded regions degrades the mobility enhancement achieved by the embedded strain inducing regions. By in situ doping of the source and drain regions the need for ion implanting these regions is eliminated and the strain associated with the embedded regions is preserved. In accordance with an embodiment of the invention, the mobility of carriers in the channel of a PFET is enhanced by the combined effects of a shallow close proximity undoped SiGe region positioned in close alignment with the gate electrode and by a deeper in situ doped SiGe region that is not relaxed by a source/drain ion implantation. As explained more fully below, PFET 20 can be formed in a bulk silicon region, in a thin silicon layer on insulator (SOI), or in the substrate supporting the SOI.

FIGS. 2-13 schematically illustrate, in cross section, method steps in the fabrication of a stressed P-channel field effect transistor 40 in accordance with an embodiment of the invention. Various steps in the manufacture of field effect transistors are well known and so, in the interest of brevity, many conventional steps will only be mentioned briefly herein or will be omitted entirely without providing the well known process details. PFET 40 can be part of an integrated circuit that includes a large number of PFETs as well as N-channel FETs (NFETs), although in this illustrative embodiment only a single field effect transistor is shown. The other transistors used in the integrated circuit can include stressed as well as unstressed transistors.

Figure 2:
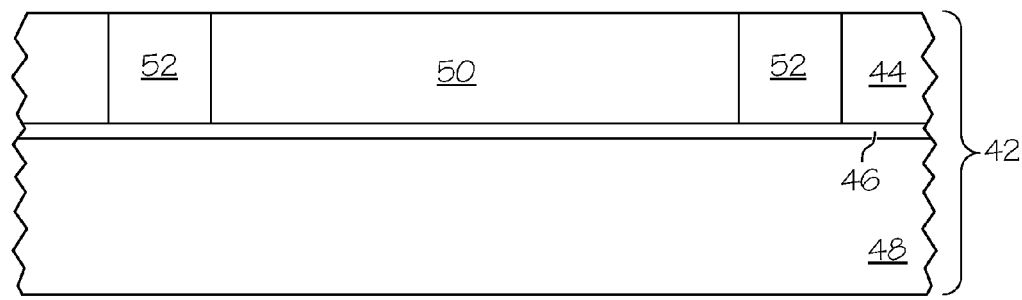
FIGS. 2-13 schematically illustrate, in cross section, method steps for the fabrication of a stressed field effect transistor in accordance with embodiments of the invention.

As illustrated in FIG. 2, the fabrication of a stressed FET 40 in accordance with an embodiment of the invention begins with providing a semiconductor substrate 42. The semiconductor substrate is preferably a monocrystalline silicon substrate wherein the term "silicon substrate" is used herein to encompass the relatively pure silicon materials typically used in the semiconductor industry. Silicon substrate 42 may be a bulk silicon wafer or, as here illustrated, without limitation, as a SOI wafer including a thin layer of silicon 44 on an insulating layer 46 that, in turn, is supported by a silicon carrier wafer 48. Preferably the silicon wafer has either a (100) or (110) orientation. The thickness of thin layer 44 depends on the type of integrated circuit being implemented, and can be, for example, about 50-120 nanometers (nm). The illustrated portion 50 of thin silicon layer 44 is doped with N-type impurity dopants. Portion 50 can be doped to the appropriate conductivity, for example, by ion implantation. Shallow trench isolation (STI) 52 is formed to electrically isolate individual devices from one another. As is well known, there are many processes that can be used to form the STI, so the process need not be described here in detail. In general, STI includes a shallow trench that is etched into the surface of the semiconductor substrate and that is subsequently filled with an insulating material. The STI preferably extends through the thickness of the thin silicon layer to underlying insulator 46. After the trench is filled with the insulating material, the surface is usually planarized, for example by chemical mechanical planarization (CMP).

Figure 3:
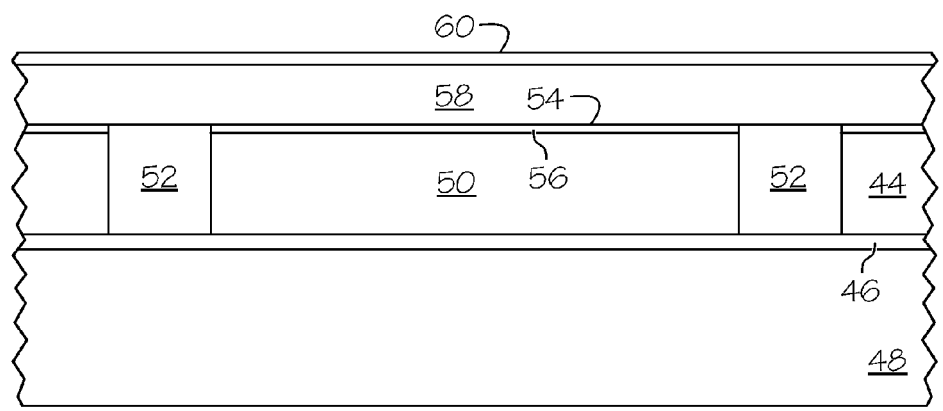

The method continues as illustrated in FIG. 3, in accordance with an embodiment of the invention, by forming a gate insulator 54 at surface 56 of silicon layer 44. Gate insulator 54 can be a silicon oxide, a high dielectric constant dielectric material, or the like, and can have a thickness of, for example, about 1-5 nm, although certain devices will require thicker or thinner gate insulators and/or gate insulators formed of multiple layers of the same or disparate materials. Preferably gate insulator 54 is silicon dioxide formed by the thermal oxidation of silicon layer 44. Alternatively, gate insulator 54 can be formed by chemical vapor deposition (CVD) or one of the variations of chemical vapor deposition such as low pressure chemical vapor deposition (LPCVD), plasma enhanced chemical vapor deposition (PECVD), or the like. Formation of the gate insulator layer is followed by the deposition of a layer of gate electrode forming material 58 and a capping layer 60. Preferably the gate electrode forming material is undoped polycrystalline silicon deposited by CVD to a thickness of about 100 nm and the capping layer is silicon nitride deposited by LPCVD to a thickness of about 30 nm. The polycrystalline silicon can be deposited, for example, by the reduction of silane ($SiH_4$) and the silicon nitride can be deposited, for example, by the reaction of dichlorosilane ($SiH_2Cl_2$) and ammonia.

Figure 4:
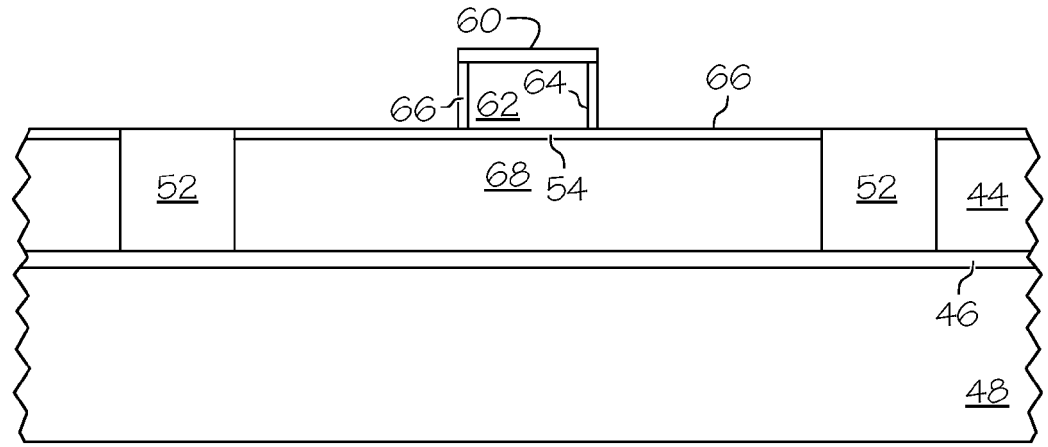

The method continues by patterning layer of gate electrode forming material 58 and capping layer 60 to form a gate electrode 62 as illustrated in FIG. 4. The two layers can be patterned and etched using conventional photolithography and etch techniques. The polycrystalline silicon layer can be etched, for example, by plasma etching using a Cl or $HBr/O_2$ chemistry and the silicon nitride can be plasma etched using a $CHF_3$, $CF_4$, or $SF_6$ chemistry. The side walls 64 of gate electrode 62 and the exposed surface of thin silicon layer 44 are thermally oxidized to grow a thin layer of silicon dioxide 66. The thin layer of silicon dioxide can be 3-4 nm in thickness and serves to protect the edge of the thin gate oxide at the base of gate electrode 62 and to separate the polycrystalline silicon from layers to be deposited in subsequent steps. Gate electrode 62 defines a channel region 68 of the FET as a portion of thin silicon layer 44 underlying the gate electrode.

Figure 5:
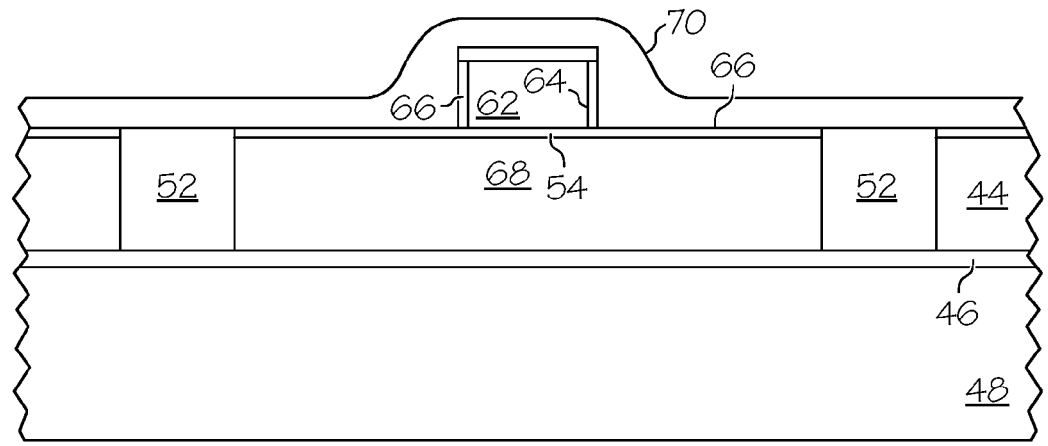

The method in accordance with one embodiment of the invention continues as illustrated in FIG. 5 by the formation of disposable side wall spacers on side walls 64 of gate electrode 62. The side wall spacers are formed on gate electrode 62 by depositing a layer of side wall forming material 70 such as a layer of silicon nitride. The silicon nitride, which can be deposited, for example to a thickness of about 8-18 nm by LPCVD, is deposited onto the remainder of capping layer 60 and thin layer of silicon dioxide 66.

Figure 6:
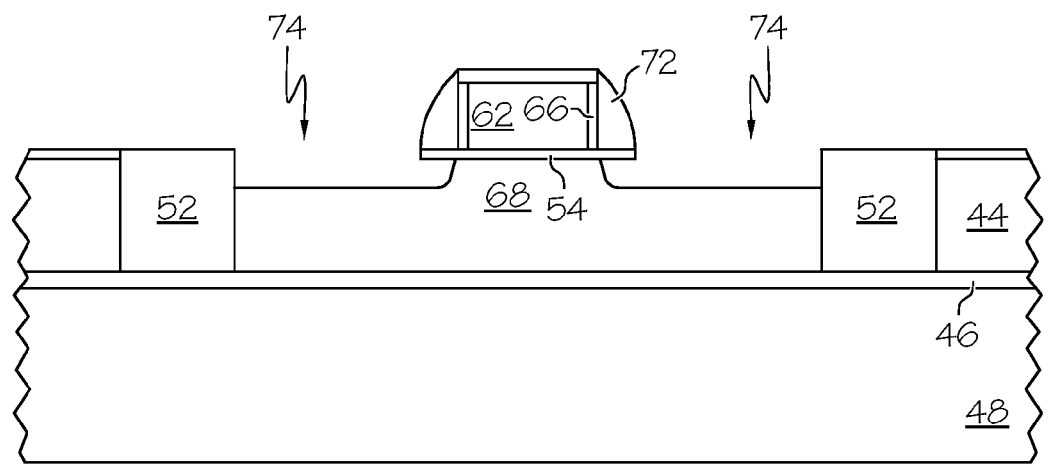

Disposable side wall spacers 72 are formed as illustrated in FIG. 6 by anisotropically etching layer 70 by reactive ion etching (RIE). The RIE leaves sidewall spacers 72 having a thickness of about 7-15 nm on the sides of gate electrode 62. The side wall spacers, capping layer 60 and STI 52 are used as an etch mask and recesses 74 are etched into the surface of thin silicon layer 44. The recesses are etched by plasma etching using $HBr/O_2$ and Cl chemistry to a depth of about 40 nm. The recesses are etched in what will become the source and drain region of the field effect transistor. The recesses are self aligned to the gate electrode and in close proximity to the ends of channel region 68. Other portions of the integrated circuit for which recesses are not intended can be masked during the plasma etch by a patterned layer of photoresist (not illustrated).

Figure 7:
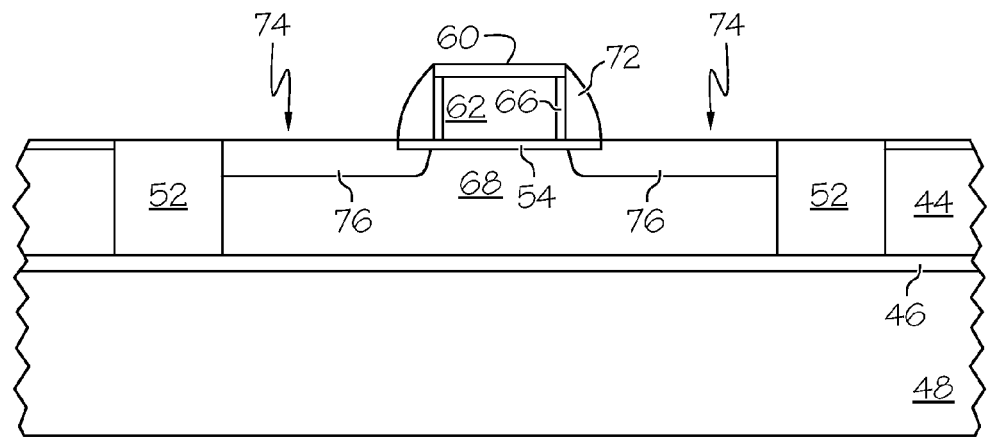

Recesses 74 are filled with an undoped layer of stress inducing material 76 as illustrated in FIG. 7. The stress inducing material can be any pseudomorphic material that can be grown on the silicon layer with a different lattice constant than the lattice constant of silicon. The difference in lattice constant of the two juxtaposed materials creates a stress in the host material. The stress inducing material can be, for example, monocrystalline silicon germanium (SiGe) having about 10-35 atomic percent and preferably about 20-35 atomic percent germanium. Preferably the stress inducing material is epitaxially grown by a selective growth process to a thickness that is sufficient to fill the recesses. Methods for epitaxially growing these materials on a silicon host in a selective manner are will known and need not be described herein. SiGe has a greater lattice constant than silicon and a compressive longitudinal stress is applied to the transistor channel. The compressive longitudinal stress increases the mobility of holes in the channel and hence improves the performance of a P-channel field effect transistor.

Figure 8:
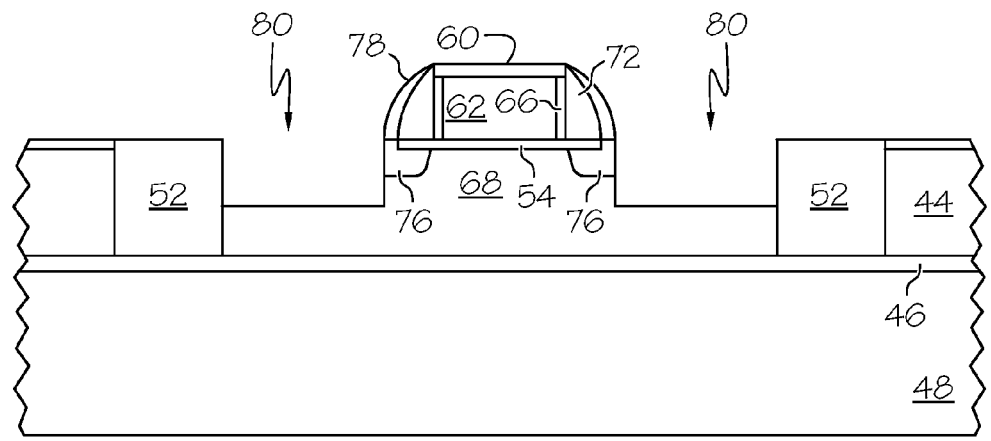

A second layer of disposable side wall spacer material (not illustrated) such as a layer of silicon nitride is blanket deposited overlying the gate electrode structure and the previously grown silicon germanium region 76. The second layer is anisotropically etched to form a second disposable side wall spacer 78 overlying side wall spacer 72 as illustrated in FIG. 8. The combined thickness of side wall spacer 72 plus side wall spacer 78 is preferably about 20-30 nm. A second recess 80 is plasma etched into thin silicon layer 44 and SiGe region 76 using capping layer 60, sidewall spacer 78 and STI 52 as an etch mask. As before, other portions of the integrated circuit for which recesses are not intended can be masked during the plasma etch by a patterned layer of photoresist (not illustrated). The plasma etch is continued until the recess has a depth of at least about 80-100 nm but is terminated before the recess extends entirely through the thickness of thin silicon layer 44 to underlying insulator layer 46. At least a thin portion of silicon layer 44 remains at the bottom of the recess. The thin remaining portion will serve as a nucleating layer for the subsequent growth of stress inducing material as explained below. Recess 80 is thus self aligned to but spaced apart from gate electrode 62 and channel region 68.

Figure 9:
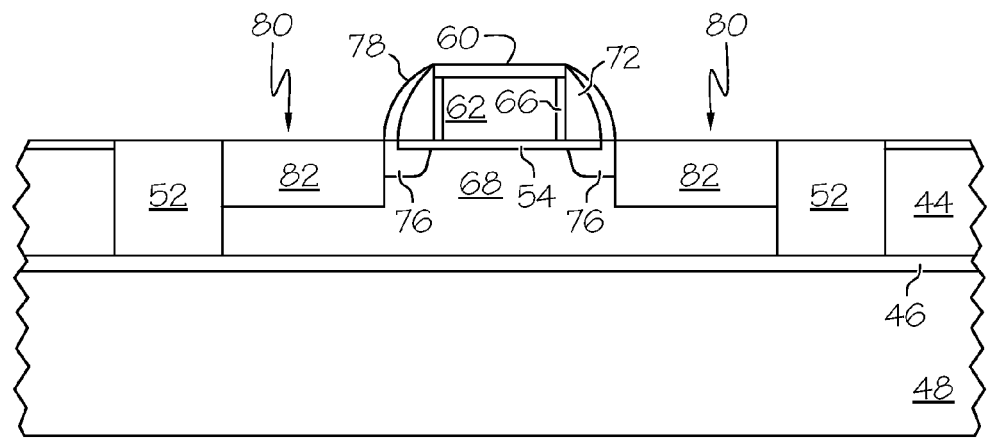

As illustrated in FIG. 9, in accordance with an embodiment of the invention, recess 80 is filled with a stress inducing material 82. As with stress inducing material 76, stress inducing material 82 can be any pseudomorphic material that can be grown on the silicon layer with a different lattice constant than the lattice constant of silicon. Preferably the stress inducing material is the same as and is grown in the same manner as stress inducing material 76. Stress inducing material 82 can be, for example, monocrystalline silicon germanium (SiGe) having about 10-35 atomic percent and preferably about 20-35 atomic percent germanium. The SiGe can be grown to a sufficient thickness to at least fill recess 80 and is preferably impurity doped with boron to a doping concentration in the range of about $1\text{-}3\times10^{20}$ $cm^{-3}$.

Figure 10:
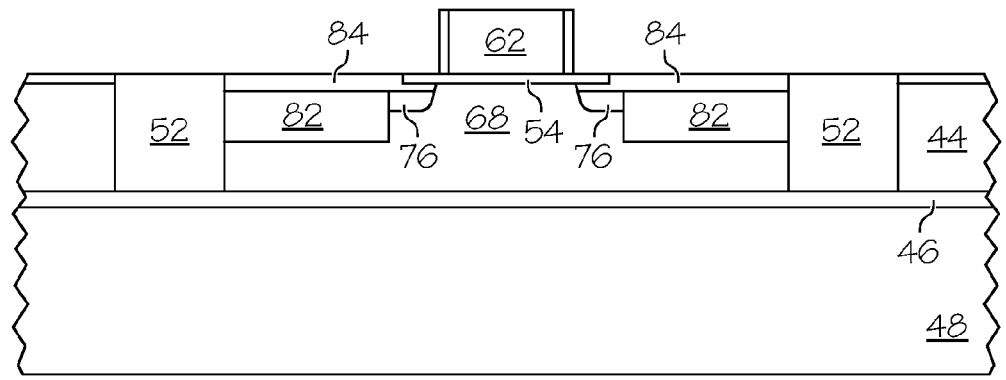

After the selective growth of SiGe material 82, sidewall spacers 72 and 78 and capping layer 60 are stripped from the device as illustrated in FIG. 10. Using gate electrode 62 and STI 52 as ion implantation masks, boron ions are implanted into the exposed portion of thin silicon layer 44, SiGe region 76 and SiGe region 82 to form source and drain extensions and HALO implant 84. The implant forms a shallow impurity doped region near the surface of the silicon and silicon germanium regions. Portions of the integrated circuit that are not to be implanted with boron ions, such as the NFET portions of the IC, can be masked with a patterned photoresist layer (not illustrated).

Figure 11:
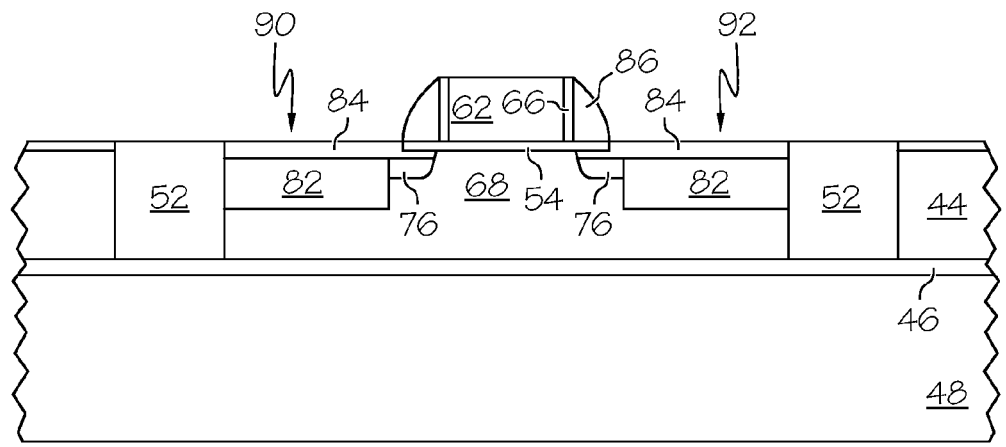

As illustrated in FIG. 11, a further layer of silicon nitride or other side wall spacer forming dielectric material (not illustrated) is blanket deposited over gate electrode 62 and the surface of the STI, thin silicon layer and SiGe epitaxial regions. The further layer of side wall spacer forming material is anisotropically etched, for example by reactive ion etching, to form permanent side wall spacers 86 on sidewalls 66 of gate electrode 62. The permanent side wall spacers and STI 52 can be used as an ion implant mask to implant additional P-type impurity dopant ions into SiGe region 82. Again, those portions of the IC that are not to receive any additional P-type impurity ions can be masked by a layer of patterned photoresist. Following the additional ion implantation, if such an implant is employed, the device receives a thermal anneal, preferably a rapid thermal anneal (RTA). The RTA activates any ion implantations that have been performed and causes out diffusion of dopant impurities from the in situ doped SiGe region 82 to form a source region 90 and a drain region 92.

Figure 12:
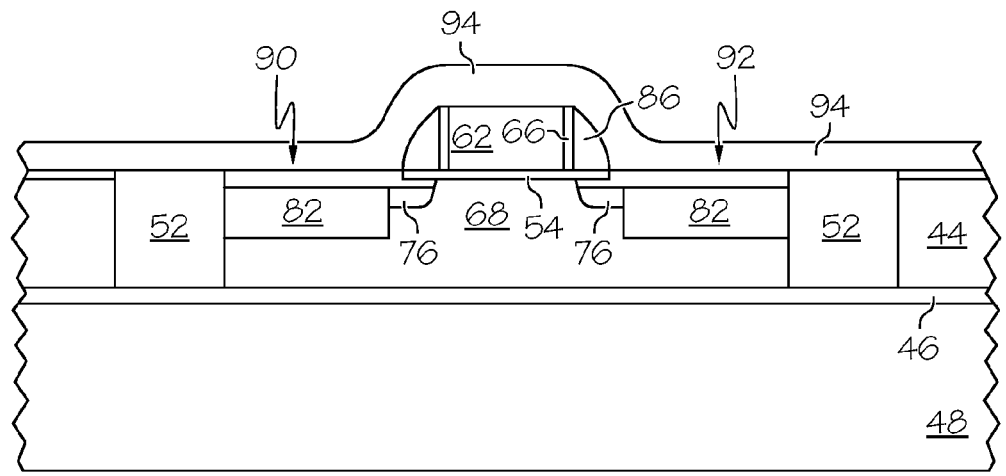
Figure 13:
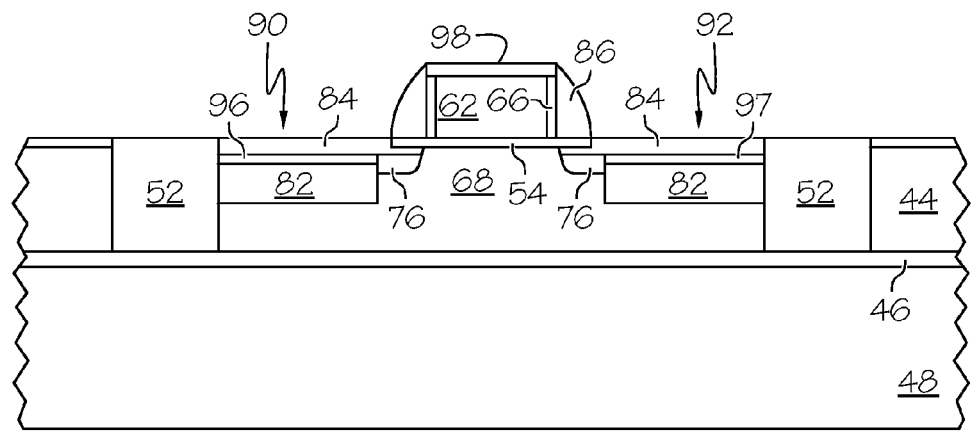

Side wall spacers 86 can also be used to form self aligned silicide regions contacting the source region, drain region, and gate electrode as a first step in providing electrical contact to the various device regions. As illustrated in FIG. 12, a layer of silicide forming metal 94 such as a layer of cobalt, nickel, titanium, or the like is deposited over the surface of the device structure of FIG. 11. The layer of silicide forming metal is heated to react the metal with the underlying silicon or silicon germanium to form metal silicide electrical contacts 96, 97, 98 to the source region, drain region, and gate electrode, respectively, as illustrated in FIG. 13. Metal that is not in contact with silicon or silicon germanium, such as metal located on STI 52 or on side wall spacers 86 does not react and can subsequently be removed by washing in a $H_2O_2/H_2SO_4$ or $HNO_3/HCl$ solution.

Figure 14:
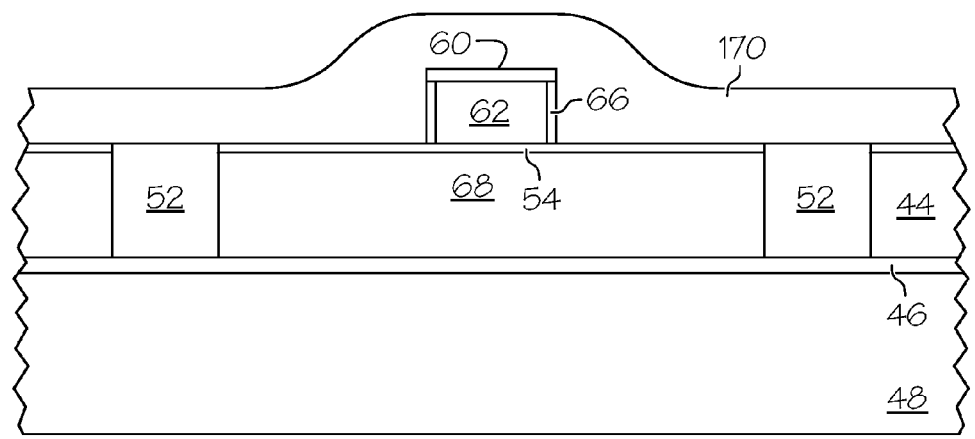
FIGS. 14-18 schematically illustrate, in cross section, method steps for the fabrication of a stressed field effect transistor in accordance with further embodiments of the invention.

In the foregoing description recess 74 was etched and shallow embedded SiGe region 76 was grown before recess 80 was etched and deep impurity doped embedded SiGe region was grown. As illustrated in cross section in FIGS. 14-18 the order of these method steps can be reversed in accordance with a further embodiment of the invention. In accordance with this embodiment of the invention the method for fabricating a PFET 140 starts in the same manner as illustrated in FIGS. 2-4. As illustrated in FIG. 14, a layer of side wall spacer forming material 170 such as a layer of silicon nitride is deposited onto the structure of FIG. 4. The layer of silicon nitride should have a thickness of about 20-30 nm.

Figure 15:
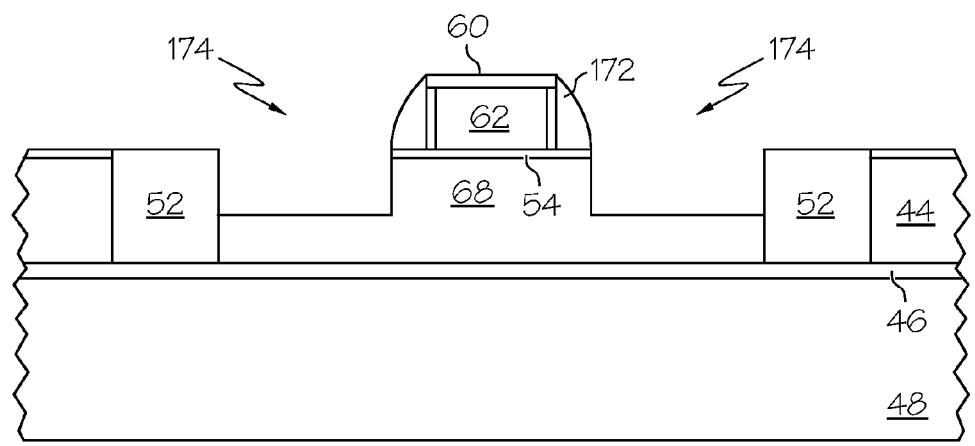

As illustrated in FIG. 15, layer 170 is anisotropically etched to form side wall spacers 172 on the edges of gate electrode 62. Side wall spacers 172, together with STI 52 and capping layer 60 are used to form an etch mask and a recess 174 is plasma etched into the surface of thin silicon layer 44. Recess 174 can have a depth of at least about 80-100 nm but is terminated before the recess extends entirely through the thickness of thin silicon layer 44 to underlying insulator layer 46. At least a thin portion of silicon layer 44 remains at the bottom of the recess. Recess 174 is self aligned with but spaced apart from gate electrode 62 and channel region 68 by a thickness dependent on the width of side wall spacers 172.

Figure 16:
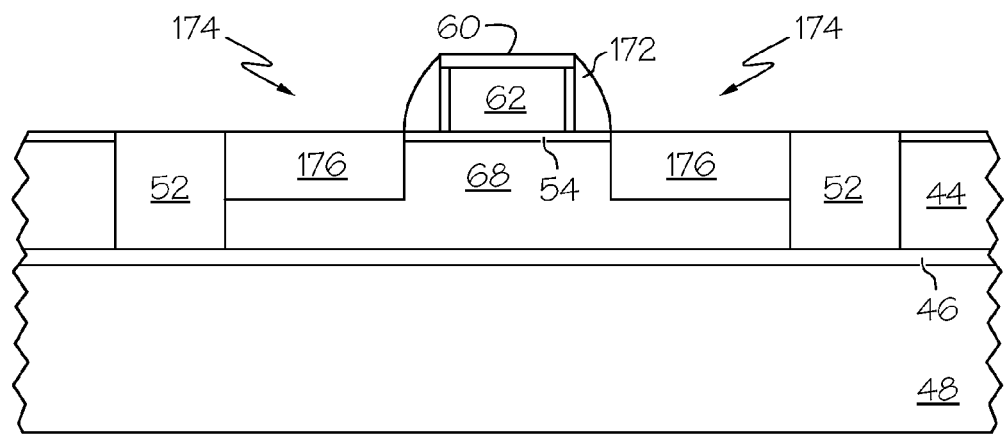

Recess 174 is filled by selectively growing an embedded epitaxial layer of stress inducing material such as a layer 176 of SiGe as illustrated in FIG. 16. Preferably the SiGe comprises about 10-35 atomic percent germanium and most preferably comprises about 20-35 atomic percent germanium. Also, the SiGe is preferably in situ impurity doped with boron to a concentration of about $1\text{-}3\times10^{20}$ $cm^{-3}$. Layer 176 can be in situ doped by adding, for example, diborane to the reactant flow during the epitaxial growth of the SiGe.

Figure 17:
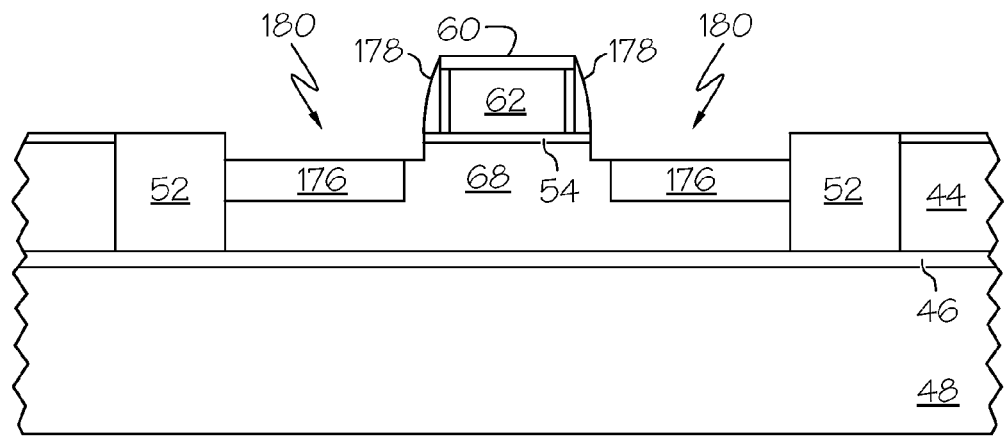

Following the selective epitaxial growth of SiGe layer 176, side wall spacers 172 are removed and new side wall spacers 178 having a thickness less than the thickness of side wall spacers 172 are formed on the side walls of gate electrode 62. Side wall spacers 178 are formed in the same manner as previously described side wall spacers 72. Side wall spacers 178 can be formed of silicon nitride or other dielectric material and preferably have a thickness of about 7-15 nm. Side wall spacers 178, capping layer 60 and STI 52 are used as an etch mask and shallow recesses 180 are plasma etched into the surface of layer 176 of SiGe as illustrated in FIG. 17. Recesses 180 preferably have a depth of about 40 nm.

Figure 18:
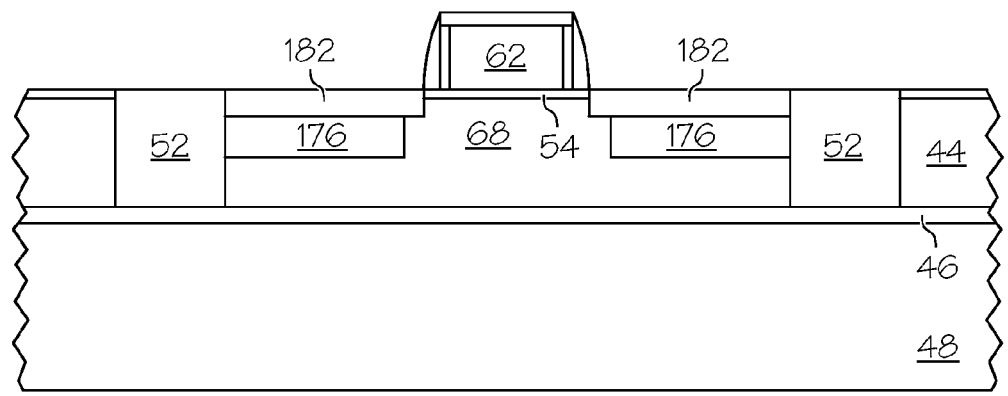

Recesses 180 are filled by selectively growing an embedded epitaxial layer of undoped stress inducing material such as a layer 182 of SiGe as illustrated in FIG. 18. Preferably the SiGe comprises about 10-35 atomic percent germanium and most preferably comprises about 20-35 atomic percent germanium. The undoped SiGe is self aligned to the gate electrode and is in close proximity to the ends of channel 68. Further processing of PFET 140 proceeds in the same manner as illustrated in FIGS. 10-13.

Figure 19:
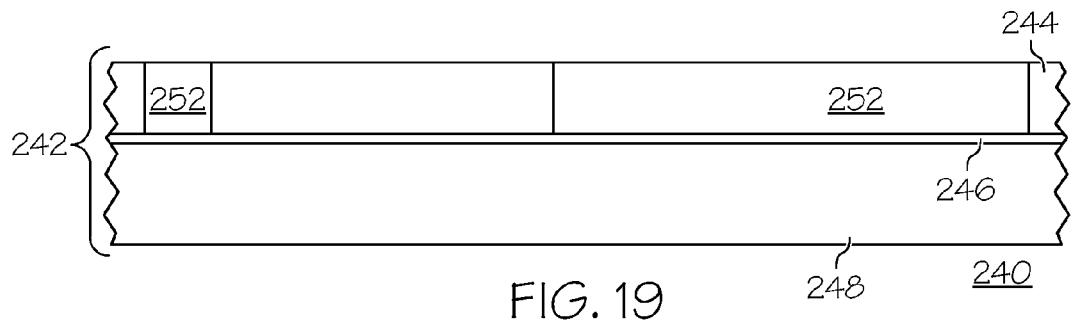
FIGS. 19-22 illustrate, in cross section, method steps for fabricating a stressed P-channel field effect transistor in accordance with a further embodiment of the invention.

FIGS. 19-22 illustrate, in cross section, method steps for fabricating a stressed PFET 240 in accordance with a further embodiment of the invention. In accordance with this embodiment of the invention a stressed PFET 240 is fabricated in the supporting substrate of a silicon on insulator (SOI) semiconductor substrate. The method for fabricating PFET 240 begins with providing a semiconductor substrate 242. As illustrated in FIG. 19, semiconductor substrate 242 includes a thin silicon layer 244 overlying an insulator layer 246 that, in turn, overlies a monocrystalline silicon substrate 248. Silicon layer 244 and silicon substrate 248 can be either (100) or (110) crystalline orientation, but preferably silicon layer 244 is (100) crystalline orientation and silicon substrate 248 is (110) crystalline orientation. Hole mobility is greater in silicon of (110) orientation than in silicon of (100) orientation and electron mobility is the opposite, being greater in silicon of (100) orientation than in silicon of (110) orientation. Regions of shallow trench isolation 252 are formed in the thin silicon layer and preferably extend through the thickness of layer 244 to insulator 246. The STI can be formed in the same manner as described above in the description of FIG. 2.

Figure 20:
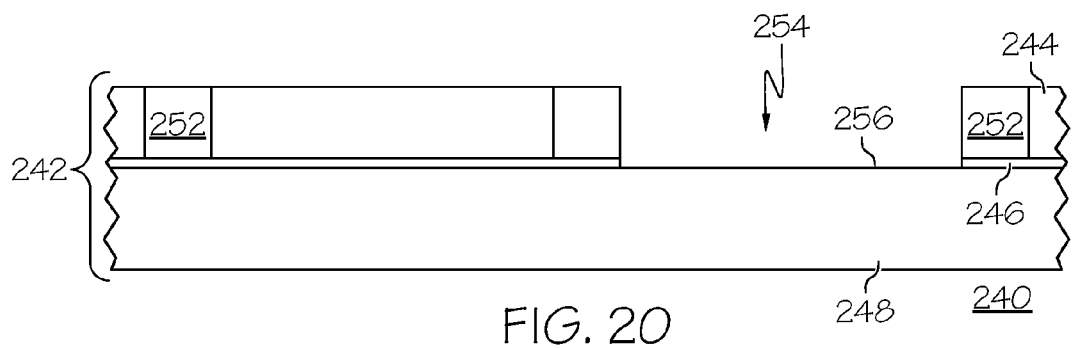
Figure 21:
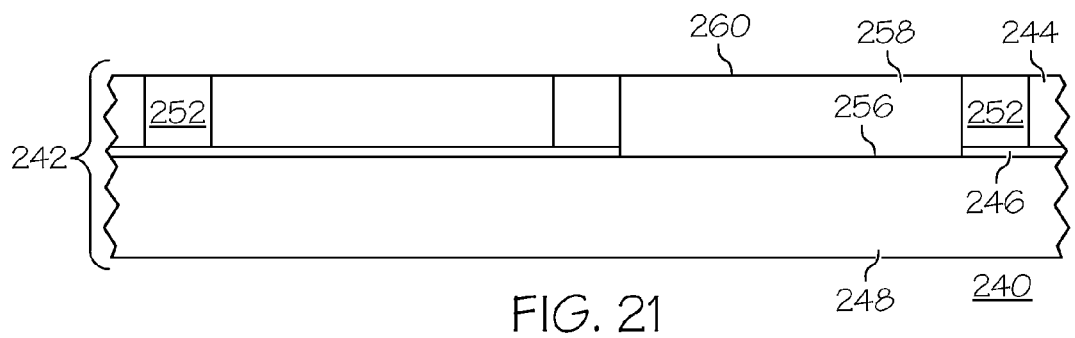

As illustrated in FIG. 20, a recess 254 is etched through one of the STI regions and through insulator layer 246 to expose a portion 256 of silicon substrate 248. A layer of patterned photoresist (not illustrated) can be used as an etch mask to define the etched area. Although a stressed PFET can be fabricated in exposed portion 256 in accordance with a method similar to that illustrate above in FIGS. 2-13 or FIGS. 14-18, it is preferable to selectively grow an epitaxial silicon layer 258 filling recess 254 as illustrated in FIG. 21. Silicon layer 258 can be selectively grown by techniques known to those of skill in the art using exposed portion 256 to nucleate monocrystalline growth having the same crystalline orientation as silicon substrate 248. Filling recess 254 with epitaxial silicon provides a substantially planar surface 260 for subsequent fabrication of transistors in both the epitaxial silicon and in the remainder of silicon layer 244. Silicon layer 258 effectively becomes an extension of silicon substrate 248, having the same crystalline orientation and preferably a (110) crystalline silicon orientation. Having a (110) substrate or substrate extension allows the fabrication of a PFET that is a hybrid orientation transistor (HOT). A HOT device takes advantage of the enhanced hole mobility for a PFET available on a (110) substrate while NFETS are fabricated in the thin silicon layer having a (100) crystalline orientation in which electrons have relatively high mobility.

Figure 22:
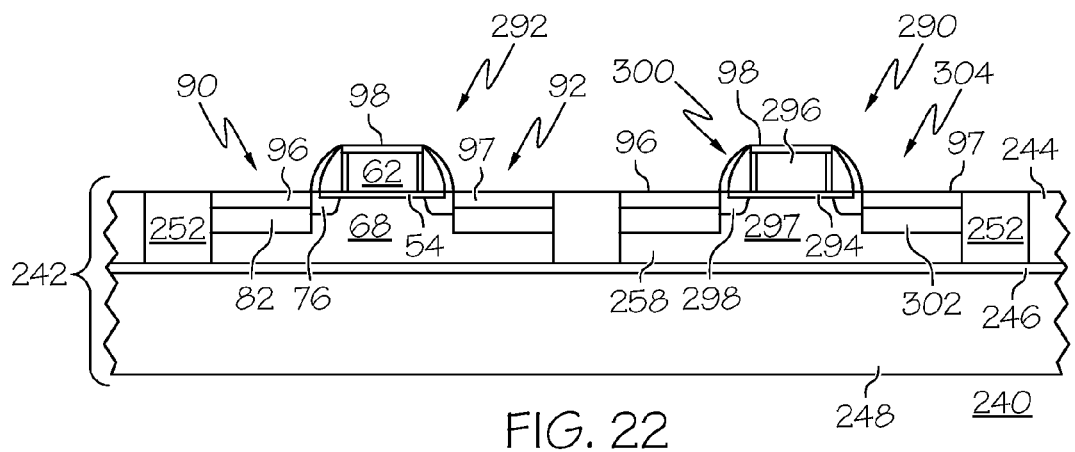

As illustrated in FIG. 22, in accordance with an embodiment of the invention, a P-channel HOT 290 is fabricated in silicon layer 258. HOT 290 can be fabricated in accordance with the method illustrated in FIGS. 2-13 or in accordance with the method illustrated in FIGS. 14-18. HOT 290 includes a layer of gate insulator 294, a gate electrode 296 formed on the gate insulator, a channel region 297 underlying gate electrode 296, a first embedded undoped epitaxial silicon germanium layer 298 grown in a recess 300, and a second impurity doped embedded epitaxial silicon germanium layer 302 formed in a second recess 304. In addition, in accordance with a further embodiment of the invention, a stressed PFET 292 can be fabricated in thin silicon layer 244 in accordance with the method illustrated in FIGS. 2-13 or in accordance with the method illustrated in FIGS. 14-18. In addition, although not illustrated, other PFETs and NFETs, either stressed or non stressed, can be fabricated in thin silicon layer 244 as necessary to implement the desired integrated circuit function.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stressed field effect transistor comprising the steps of:
    forming a silicon on insulator substrate comprising a layer of silicon on a layer of insulator on a silicon substrate;
    forming a gate electrode overlying the layer of silicon;
    epitaxially growing a first undoped silicon germanium layer embedded into the silicon layer and aligned with the gate electrode; and
    epitaxially growing a second in situ impurity doped silicon germanium layer embedded into the layer of silicon and spaced apart from the gate electrode.

2. The method of claim 1 further comprising the step of implanting conductivity determining ions into the first undoped silicon germanium layer, the second in situ impurity doped silicon germanium layer and the layer of silicon to form source and drain extensions.

3. The method of claim 1 wherein the step of epitaxially growing a first undoped silicon germanium layer comprises the step of epitaxially growing a first undoped silicon germanium layer embedded into the silicon layer and into a portion of the second in situ impurity doped silicon germanium layer.

4. The method of claim 1 wherein the step of epitaxially growing a second in situ impurity doped silicon germanium layer comprises the step of epitaxially growing a second in situ impurity doped silicon germanium layer embedded into the silicon layer and extending through a portion of the first undoped silicon germanium layer.

5. The method of claim 1 wherein the step of forming a silicon on insulator substrate comprises the step of forming a layer of silicon having a <100>orientation on a layer of insulator on a silicon substrate having a <110>orientation.

6. The method of claim 1 wherein the step of forming a gate electrode overlying the layer of silicon comprises:
    growing a layer of silicon dioxide at the surface of the silicon substrate; and forming a polycrystalline silicon gate electrode on the layer of silicon dioxide.

7. The method of claim 6 wherein the step of epitaxially growing a first undoped silicon germanium layer embedded into the silicon layer and aligned with the gate electrode comprises:
   etching a first recess into the silicon layer in alignment with the gate electrode; and
   epitaxially growing a first undoped silicon germanium layer filling the first recess.

8. The method of claim 6 wherein the step of epitaxially growing a second in situ impurity doped silicon germanium layer comprises:
   etching a second recess to remove a portion of the first undoped silicon germanium layer and to expose a portion of the layer of silicon, wherein the second recess is spaced apart from the gate electrode; and
   epitaxially growing a second in situ impurity doped silicon germanium layer from an exposed surface of the layer of silicon, wherein the second in situ impurity doped silicon germanium layer fills the second recess, is embedded into the silicon layer and is spaced apart from the gate electrode by a remaining portion of the first undoped silicon germanium layer.

9. A method for fabricating a stressed field effect transistor comprising the steps of:
   forming a silicon on insulator substrate comprising a layer of silicon on a layer of insulator on a silicon substrate;
   forming a gate electrode overlying the layer of silicon;
   etching a first recess into the silicon layer in alignment with the gate electrode;
   epitaxially growing a first undoped silicon germanium layer that fills the first recess, wherein the first undoped silicon germanium layer is embedded into the silicon layer and is aligned with the gate electrode;
   etching a second recess to remove a portion of the first undoped silicon germanium layer and to expose a portion of the layer of silicon, the second recess being spaced apart from the gate electrode; and
   epitaxially growing a second in situ impurity doped silicon germanium layer that fills the second recess, wherein the second in situ impurity doped silicon germanium layer is embedded into the silicon layer and is spaced apart from the gate electrode by a remaining portion of the first undoped silicon germanium layer.

10. A method for fabricating a stressed field effect transistor comprising the steps of:
   forming a silicon on insulator substrate comprising a layer of silicon on a layer of insulator on a silicon substrate;
   forming a gate electrode overlying the layer of silicon;
   etching a first recess into the silicon layer in alignment with the gate electrode;
   selectively growing a first undoped epitaxial silicon germanium layer that fills the first recess, wherein the first undoped epitaxial silicon germanium layer is embedded into the silicon layer and is aligned with the gate electrode;
   etching a second recess to remove a portion of the first undoped epitaxial silicon germanium layer and to expose a portion of the layer of silicon, the second recess being spaced apart from the gate electrode; and
   selectively growing a second in situ impurity doped epitaxial silicon germanium layer from the exposed portion of the layer of silicon, wherein the second in situ impurity doped epitaxial silicon germanium layer fills the second recess, is embedded into the silicon layer, and is spaced apart from the gate electrode by a remaining portion of the first undoped epitaxial silicon germanium layer.

* * * * *